(12) United States Patent
Matsuda

(10) Patent No.: US 11,594,507 B2
(45) Date of Patent: Feb. 28, 2023

(54) METHOD FOR MANUFACTURING SEMICONDUCTOR DEVICE

(71) Applicant: SUMITOMO ELECTRIC DEVICE INNOVATIONS, INC., Kanagawa (JP)

(72) Inventor: Keita Matsuda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 17/237,776

(22) Filed: Apr. 22, 2021

(65) Prior Publication Data
US 2021/0351147 A1 Nov. 11, 2021

(30) Foreign Application Priority Data
May 11, 2020 (JP) .............................. JP2020-083020

(51) Int. Cl.
*H01L 23/498* (2006.01)
*H01L 21/50* (2006.01)
*H01L 21/48* (2006.01)
*H01L 21/60* (2006.01)
*H01L 23/00* (2006.01)

(52) U.S. Cl.
CPC .......... *H01L 24/11* (2013.01); *H01L 21/4846* (2013.01); *H01L 21/50* (2013.01); *H01L 23/49816* (2013.01); *H01L 24/13* (2013.01); H01L 2021/60232 (2013.01); H01L 2224/13009 (2013.01)

(58) Field of Classification Search
CPC ....................................................... H01L 24/11
See application file for complete search history.

(56) References Cited

U.S. PATENT DOCUMENTS

2017/0365571 A1* 12/2017 Matsuda ............... H01L 21/486

FOREIGN PATENT DOCUMENTS

| JP | 2006-120803 | 5/2006 |
| JP | 2017-228583 | 12/2017 |

* cited by examiner

*Primary Examiner* — William A Harriston
(74) *Attorney, Agent, or Firm* — Smith, Gambrell & Russell, LLP.

(57) ABSTRACT

A method for manufacturing a semiconductor device includes forming a thermosetting resin film on a first metal layer, forming an opening in the resin film, forming a second metal layer that covers a region from an upper surface of the first metal layer exposed from the opening of the resin film to an upper surface of the resin film, performing heat treatment at a temperature equal to or higher than a temperature at which the resin film is cured after forming the second metal layer, forming a cover film that covers the upper surface of the resin film and a side surface of the second metal layer after performing the heat treatment, and forming a solder on an upper surface of the second metal layer exposed from an opening of the cover film after forming the cover film.

8 Claims, 4 Drawing Sheets

METHOD FOR MANUFACTURING SEMICONDUCTOR DEVICE

CROSS-REFERENCE TO RELATED APPLICATION

This application claims priority based on Japanese Patent Application No. 2020-083020 filed on May 11, 2020, and the entire contents of the Japanese patent application are incorporated herein by reference.

FIELD OF THE INVENTION

The present disclosure relates to a method for manufacturing a semiconductor device.

BACKGROUND ART

A Ball Grid Array (BGA) packages is sometimes used to flip-chip mount a semiconductor device on a substrate. Solder balls are formed on such a semiconductor device. For example, Patent Document 1 (Japanese Laid-open Patent Publication No. 2006-120803) describes a semiconductor device having solder bumps on electrodes formed by a plurality of metal films including reinforcing layers.

In order to prevent a solder from diffusing into a wiring layer, a metal layer (UBM: Under Bump Metal) is sometimes provided on the wiring layer and solder balls are sometimes provided thereon. In order to protect a semiconductor layer from moisture or the like, an insulating film made of polyimide, for example, is provided on the semiconductor layer.

SUMMARY OF THE INVENTION

A method for manufacturing a semiconductor device according a present disclosure includes forming a thermosetting resin film on a first metal layer, forming an opening in the resin film, forming a second metal layer that covers a region from an upper surface of the first metal layer exposed from the opening of the resin film to an upper surface of the resin film, performing heat treatment at a temperature equal to or higher than a temperature at which the resin film is cured after forming the second metal layer, forming a cover film that covers the upper surface of the resin film and a side surface of the second metal layer after performing the heat treatment, and forming a solder on an upper surface of the second metal layer exposed from an opening of the cover film after forming the cover film.

DESCRIPTION OF EMBODIMENTS

Figure 1A:
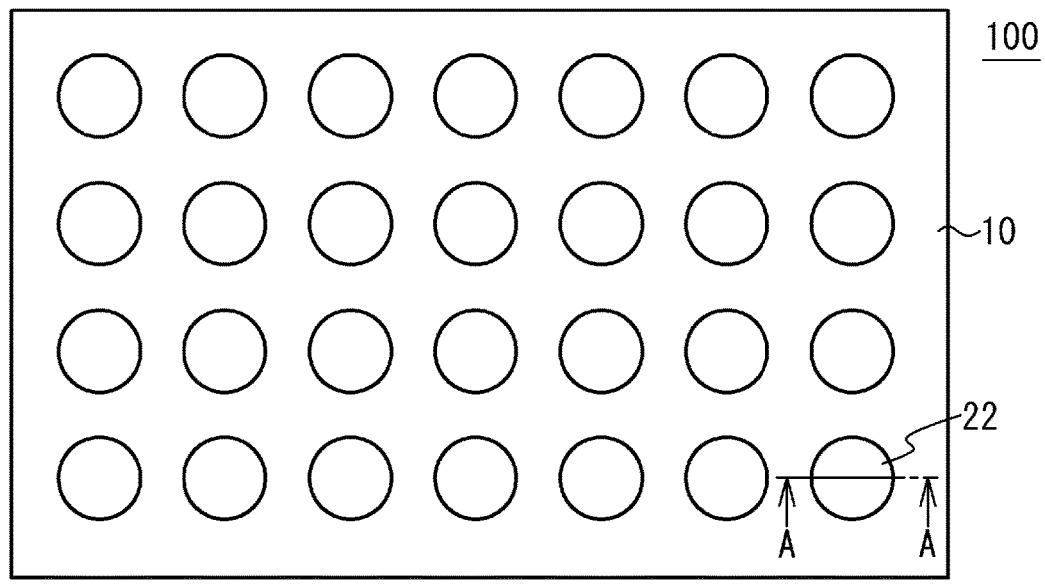
FIG. 1A is a plan view illustrating a semiconductor device according to an embodiment.

Since a coefficient of thermal expansion of the metal layer is different from that of the insulating film, the adhesion between the metal layer and the insulating film is reduced due to a temperature change when the solder balls are provided. A gap may occur between the metal layer and the insulating film. The solder may enter the gap and reach the wiring layer. The solder migrates to the wiring layer, which reduces the reliability of the semiconductor device. Therefore, it is an object of the present disclosure to provide a method for manufacturing a semiconductor device that can suppress the solder from entering the gap.

DESCRIPTION OF EMBODIMENTS OF THE PRESENT DISCLOSURE

First, the contents of embodiments of the present disclosure will be listed and described.

A method for producing a semiconductor optical device according to an embodiment of the present disclosure includes: (1) forming a thermosetting resin film on a first metal layer, forming an opening in the resin film, forming a second metal layer that covers a region from an upper surface of the first metal layer exposed from the opening of the resin film to an upper surface of the resin film, performing heat treatment at a temperature equal to or higher than a temperature at which the resin film is cured after forming the second metal layer, forming a cover film that covers the upper surface of the resin film and a side surface of the second metal layer after performing the heat treatment, and forming a solder on an upper surface of the second metal layer exposed from an opening of the cover film after forming the cover film. The heat treatment generates a gap between the second metal layer and the resin film. By closing the gap with the cover film, it is possible to suppress the solder from entering in the step of forming the solder.

(2) The resin film may be a polyimide film. The heat treatment causes the resin film to shrink, and the gap is formed between the resin film and the second metal layer. By closing the gap with the cover film, it is possible to suppress the solder from entering.

(3) The step of forming the second metal layer may include forming a third metal layer that covers the region from the upper surface of the first metal layer exposed from the opening of the resin film to the upper surface of the resin film, and forming a fourth metal layer that covers a region from an upper surface of the third metal layer to a portion of the upper surface of the resin film that is outside the third metal layer. The second metal layer includes the third metal layer and the fourth metal layer, and functions as a barrier that suppresses the diffusion of the solder into the first metal layer.

(4) The first metal layer may include gold, the third metal layer may include palladium, and the step of forming the fourth metal layer may be forming the fourth metal layer including nickel by electroless plating treatment. The second metal layer includes the third metal layer and the fourth metal layer, and functions as a barrier that suppresses the diffusion of the solder into the first metal layer. A stress is applied to the fourth metal layer by the heat treatment, and the adhesion between the fourth metal layer and the resin film is reduced. The cover film can suppress the solder from entering.

(5) A solder wettability of the cover film may be lower than that of the second metal layer. It is possible to effectively suppress the solder from entering.

(6) The step of forming the cover film may be forming the cover film that covers a region from the upper surface of the resin film to the upper surface of the second metal layer. The cover film is less likely to peel off, and it is possible to effectively suppress the solder from entering.

(7) A temperature in the heat treatment may be equal to or more than a melting point of the solder. Before the step of forming the solder, the gap is formed in advance between the second metal layer and the resin film by performing the heat treatment at the temperature equal to or more than the melting point of the solder. The stress is less likely to be applied to the cover film in the step of forming the solder ball. By closing the gap with the cover film, it is possible to suppress the solder from entering.

DETAILS OF EMBODIMENTS OF THE PRESENT DISCLOSURE

A description will be given of embodiments of the method for manufacturing the semiconductor device according to embodiments of the present disclosure, with reference to drawings. The present disclosure is not limited to the specifically disclosed embodiments and variations but may include other embodiments and variations without departing from the scope of the present invention.
(Semiconductor Device)

FIG. 1A is a cross-sectional view illustrating a semiconductor device 100 according to an embodiment. As illustrated in FIG. 1A, the semiconductor device 100 is a BGA type semiconductor device having a plurality of solder balls 22 provided on a surface of a substrate 10. The plurality of solder balls 22 are arranged in a grid pattern on one surface of the substrate 10, and are pads used for electrical connection between the semiconductor device 100 and an external device.

Figure 1B:
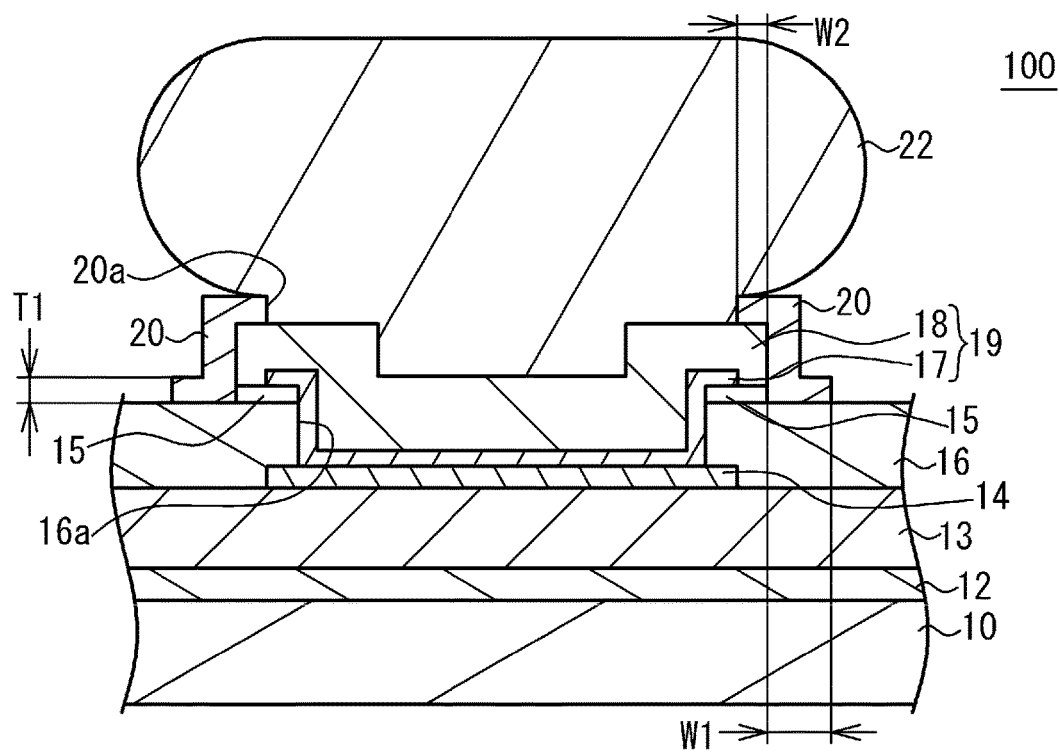
FIG. 1B is a cross-sectional view taken along a line A-A of FIG. 1A.

FIG. 1B is a cross-sectional view taken along a line A-A of FIG. 1A. As illustrated in FIG. 1B, the semiconductor device 100 includes the substrate 10, a semiconductor layer 12, an insulating film 13, a resin film 16, a wiring layer 14 (a first metal layer), a UBM 19 (a second metal layer), a cover film 20 and a solder ball 22.

The substrate 10 is an insulating substrate made of an insulator such as silicon carbide (SiC) or sapphire. The semiconductor layer 12 is provided on an upper surface of the substrate 10. The semiconductor layer 12 includes, for example, a channel layer of gallium nitride (GaN) and an electron supply layer of aluminum gallium nitride (AlGaN) to form a field effect transistor (FET).

The insulating film 13 is, for example, an inorganic insulating film such as silicon nitride (SiN) having a thickness of 0.1 to 0.5 µm or an organic insulating film such as polyimide, and is a passivation film that covers an upper surface of the semiconductor layer 12.

The wiring layer 14 is provided on an upper surface of the insulating film 13 and is made of a metal such as gold (Au). The insulating film 13 has an opening (not illustrated), and the wiring layer 14 is electrically connected to the semiconductor layer 12 through the opening.

The resin film 16 is provided on the upper surface of the insulating film 13, and is an interlayer film made of a thermosetting resin such as polyimide or benzocyclobutene (BCB) having a thickness of 5 µm. The resin film 16 has an opening 16a above the wiring layer 14.

The UBM 19 includes a base layer 17 (a third metal layer) and a plating layer 18 (a fourth metal layer). The base layer 17 has a thickness of 15 nm for example, and is a laminate including a titanium (Ti) layer and a palladium (Pd) layer. The base layer 17 is provided on the upper surface of the wiring layer 14 exposed from the opening 16a, an inner wall of the opening 16a, and a portion of the upper surface of the resin film 16 in the vicinity of the opening 16a. The plating layer 18 is formed, for example, by electroless plating treatment and is made of nickel-phosphorus (Ni—P) or the like having a thickness of 3.5 nm. The plating layer 18 is provided on an upper surface and a side surface of the base layer 17 and is further provided above the resin film 16 through a gap 15. The gap 15 is formed between a lower surface of the UBM 19 and the upper surface of the resin film 16.

The cover film 20 covers the upper surface of the resin film 16, the side surface of the UBM 19, and an upper surface of a peripheral edge of the UBM 19. The cover film 20 surrounds the UBM 19 and the gap 15, and closes the gap 15. For example, the cover film 20 may be made of a metal such as zinc (Zn), chromium (Cr), nickel-chromium alloy (Ni/Cr), titanium (Ti), molybdenum (Mo), aluminum (Al) or iron (Fe), or made of an oxide of these metals. Alternatively, the cover film 20 may be made of an insulator such as SiN or $SiO_2$, or a resin such as polyimide. The cover film 20 may have a thickness T1 sufficient to close the gap 15. The thickness T1 of the cover film 20 made of polyimide is, for example, 5 µm. The thickness T1 of the cover film 20 made of metal or insulator is, for example, 1.5 µm. The cover film 20 made of polyimide covers a region between the plurality of UBMs 19, and a width W1 of a portion of the cover film 20 in contact with the resin film 16 is, for example, 200 µm. The width W1 of the portion of the cover film 20 made of metal or insulator is, for example, 1.5 µm. A width W2 of a portion of the cover film 20 in contact with the plating layer 18 is, for example, 1.5 µm. The cover film 20 has an opening 20a.

The solder ball 22 is made of a metal such as tin and gold alloy (Sn—Au), tin and silver alloy (Sn—Ag), or tin, silver and copper alloy (Sn—Ag—Cu). The solder ball 22 is in contact with the upper surface of the plating layer 18 of the UBM 19 exposed from the opening 20a of the cover film 20.
(Manufacturing Method)

FIGS. 2A to 3C are cross-sectional views illustrating a method for manufacturing the semiconductor device 100, and illustrate a cross section corresponding to FIG. 1B. Before a step of FIG. 2A, the semiconductor layer 12 is epitaxially grown on the upper surface of the substrate 10 by, for example, a metalorganic chemical vapor deposition (MOCVD) method or the like. For example, the insulating film 13 made of SiN is formed on the upper surface of the semiconductor layer 12 by a chemical vapor deposition (CVD) method or the like.

Figure 2A:
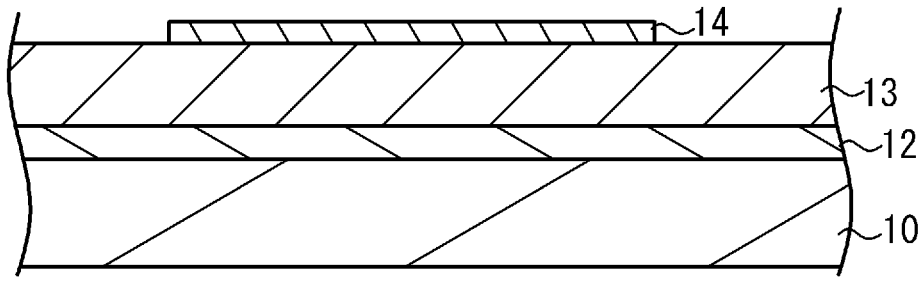
FIG. 2A is a cross-sectional view illustrating a method for manufacturing the semiconductor device.
Figure 2B:
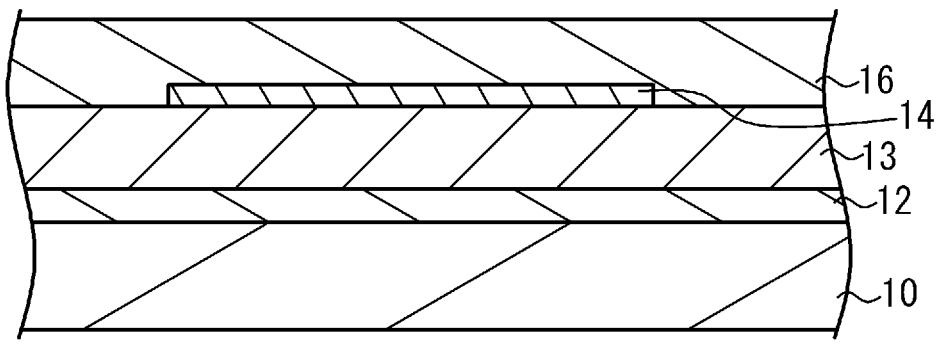
FIG. 2B is a cross-sectional view illustrating the method for manufacturing the semiconductor device.
Figure 2C:
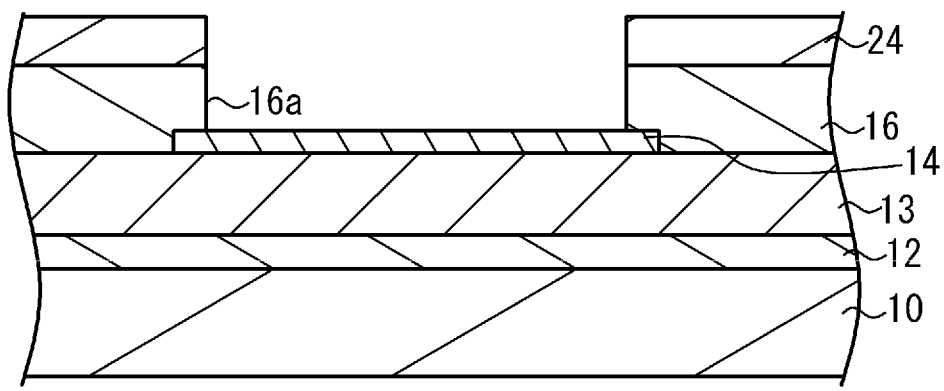
FIG. 2C is a cross-sectional view illustrating the method for manufacturing the semiconductor device.

As illustrated in FIG. 2A, the wiring layer 14 is formed on the upper surface of the insulating film 13 by electrolytic plating treatment or the like. As illustrated in FIG. 2B, the resin film 16 is formed on the upper surface of the insulating film 13. As illustrated in FIG. 2C, a photosensitive photoresist is provided on the upper surface of the resin film 16, and resist patterning is performed to provide a resist mask 24. The resin film 16 is etched using the resist mask 24 to form the opening 16a in the resin film 16. The wiring layer 14 is exposed from the opening 16a. After etching, the resist mask 24 is removed.

Figure 2D:
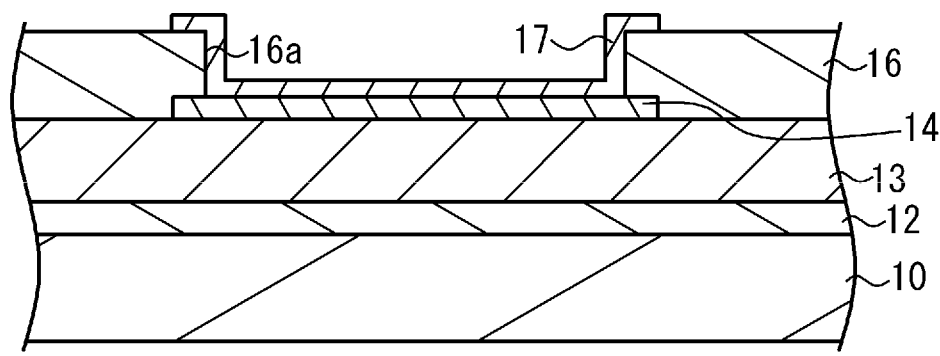
FIG. 2D is a cross-sectional view illustrating the method for manufacturing the semiconductor device.
Figure 3A:
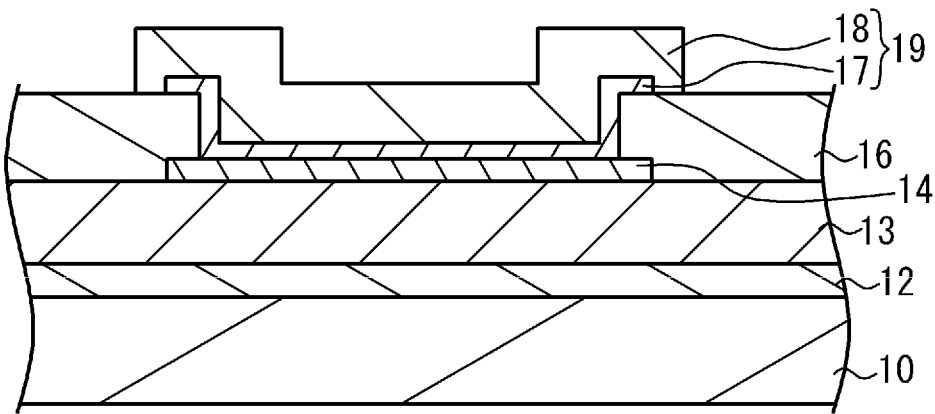
FIG. 3A is a cross-sectional view illustrating the method for manufacturing the semiconductor device.

As illustrated in FIG. 2D, the base layer 17 is formed from the upper surface of the wiring layer 14 to a portion of the upper surface of the resin film 16 near the opening 16a by vacuum deposition and lift-off. As illustrated in FIG. 3A, the plating layer 18 is formed by, for example, electroless plating treatment that uses the base layer 17 as a seed metal. The plating layer 18 is provided from the upper surface of the base layer 17 to a portion of the upper surface of the resin film 16 that is outside the base layer 17. The base layer 17 and the plating layer 18 are in contact with the upper surface of the resin film 16.

Figure 3B:
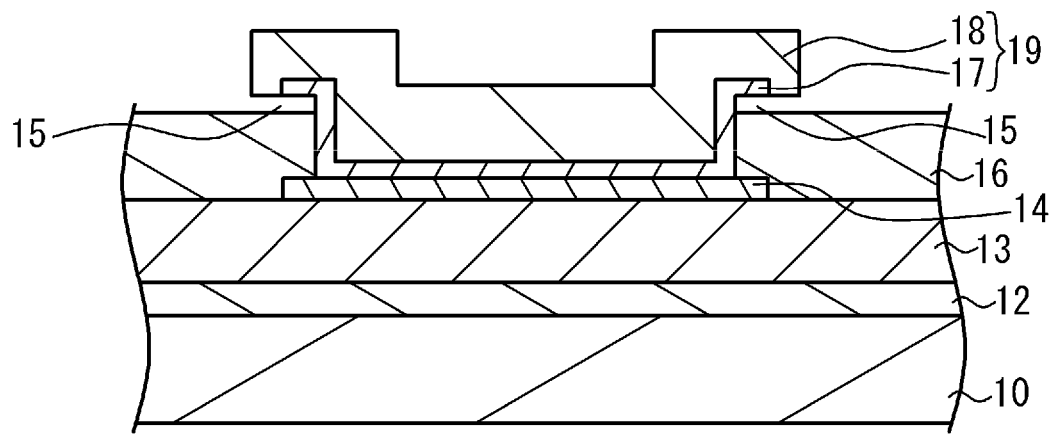
FIG. 3B is a cross-sectional view illustrating the method for manufacturing the semiconductor device.

After the plating layer 18 is formed, heat treatment is performed by keeping the temperature at 350° C. for 30 minutes, for example. Since the resin film 16 is a thermosetting resin such as polyimide, it shrinks by the heat treatment. A stress is applied to the plating layer 18, which reduces the adhesion between the UBM 19 and the resin film 16. As a result, the gap 15 is formed between the UBM 19 and the resin film 16, as illustrated in FIG. 3B.

Figure 3C:
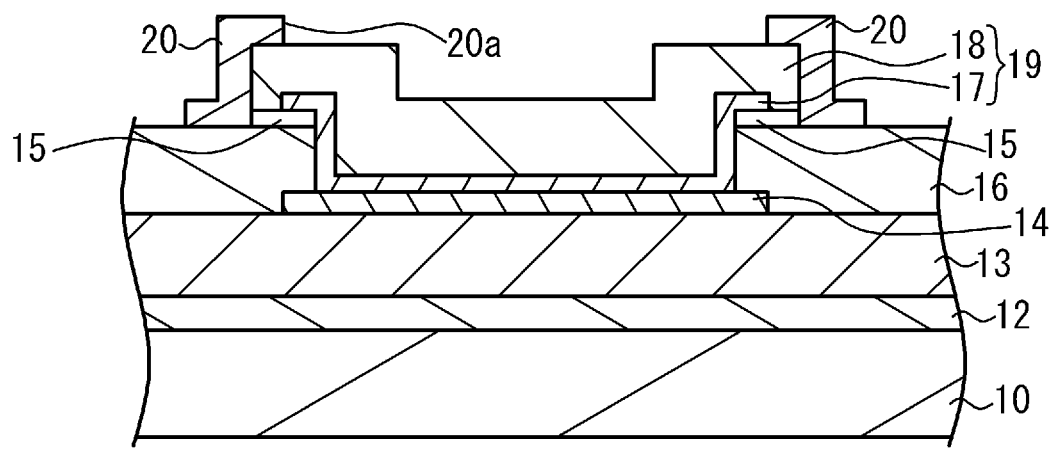
FIG. 3C is a cross-sectional view illustrating the method for manufacturing the semiconductor device.

As illustrated in FIG. 3C, after the heat treatment, the cover film 20 is formed by vacuum deposition, lift-off, plating treatment, or the like. The cover film 20 covers a region from the upper surface of the resin film 16 to an outer peripheral portion of the upper surface of the plating layer 18, and closes the gap 15. The upper surface of the plating layer 18 is exposed from the opening 20a of the cover film 20.

After the cover film 20 is provided, flux is applied to the upper surface of the plating layer 18 exposed from the opening 20a. A solder paste is placed on the upper surface of the plating layer 18, the temperature is raised to a temperature equal to or higher than a melting point of the solder, such as 260° C., and reflow treatment is performed. The solder ball 22 is formed on the plating layer 18 by the reflow treatment. The semiconductor device 100 is formed by the above steps.

COMPARATIVE EXAMPLE

Figure 4:
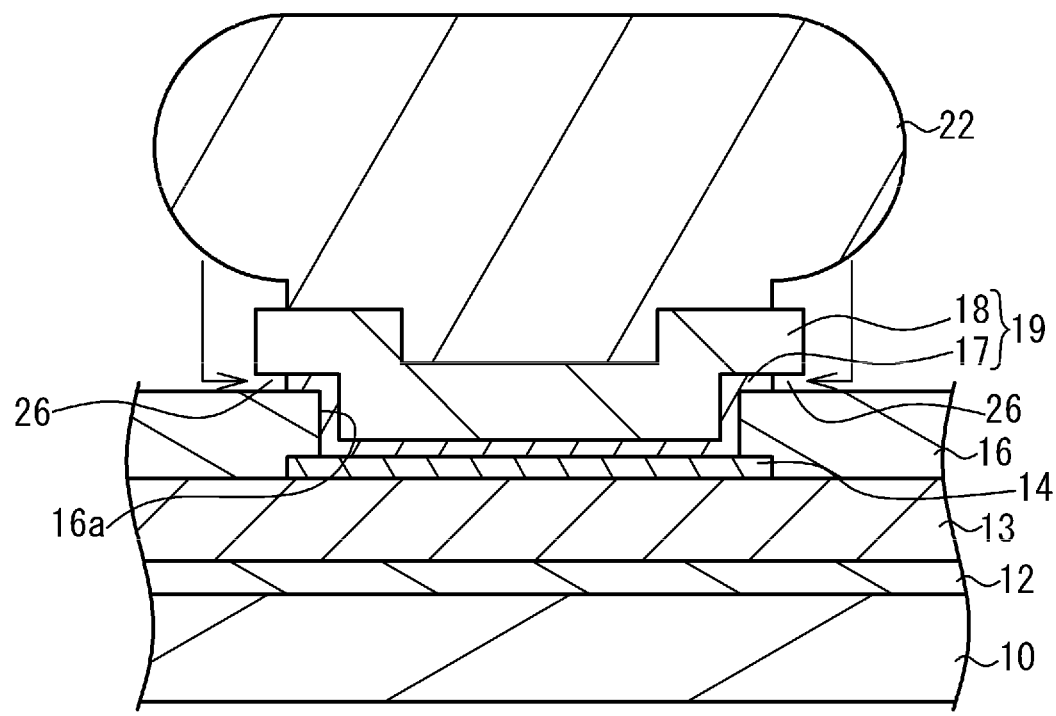
FIG. 4 is a cross-sectional view illustrating a method for manufacturing a semiconductor device according to a comparative example.

FIG. 4 is a cross-sectional view illustrating a method for manufacturing a semiconductor device according to a comparative example. The steps from FIG. 2A to FIG. 3A are also performed in the comparative example. In the comparative example, after the UBM 19 is formed, the reflow treatment is performed without performing the heat treatment and the formation of the cover film 20. As illustrated in FIG. 4, the solder ball 22 is formed. In the reflow treatment, the temperature is raised to 260° C., which is above the melting point of the solder. The stress is applied to the plating layer 18 of the UBM 19 due to a difference in the coefficient of thermal expansion between the UBM 19 and the resin film 16. The stress generates the gap 26 between the plating layer 18 and the resin film 16. This reduces the function of the plating layer 18 as a barrier against solder.

As indicated by arrows in FIG. 4, a part of the melted solder enters the gap 26 and diffuses into the wiring layer 14 through, for example, the base layer 17. Further, the solder penetrates from an interface between the base layer 17 and the resin film 16 to the wiring layer 14, for example. The solder reacts with Au in the wiring layer 14, causing migration. As a result, the life of the semiconductor device is shortened.

In contrast, according to the present embodiment, the UBM 19 is provided on a region from the upper surface of the wiring layer 14 to the upper surface of the resin film 16, and then the heat treatment is performed. Since the resin film 16 is the thermosetting resin such as polyimide, the resin film 16 shrinks by the heat treatment, and the gap 15 can be formed in advance between the resin film 16 and the UBM 19. After the heat treatment, the cover film 20 is provided to cover the side surface of the UBM 19, and the solder ball 22 is formed. Closing the gap 15 generated by the heat treatment with the cover film 20 can suppress the solder from entering the gap 15. As a result, the migration between the solder and the wiring layer 14 can also be suppressed. Deterioration of the life of the semiconductor device 100 is suppressed.

The gap 15 is formed in advance between the resin film 16 and the UBM 19 by the heat treatment. When the temperature is raised in the reflow treatment, the stress can be suppressed from being applied to the cover film 20, and peeling and damage of the cover film 20 can be suppressed. The resin film 16 is a protective film that is made of a resin such as polyimide and protects the semiconductor device 100 from moisture or the like.

The UBM 19 functions as a barrier that suppresses the diffusion of the solder into the wiring layer 14. For example, the UBM 19 includes the base layer 17 and the plating layer 18 that are laminated in order. In order to enhance barrier performance to the solder, it is preferable that the base layer 17 includes Pd and the plating layer 18 includes Ni. The plating layer 18 is a Ni—Pd film formed by, for example, electroless plating treatment, is denser than a metal layer formed by vapor deposition, and has high performance as a barrier.

On the other hand, the plating layer 18 is in contact with the upper surface of the resin film 16 (see FIG. 3A), and the coefficient of thermal expansion of the plating layer 18 is different from that of the resin film 16. Therefore, the stress is applied to the plating layer 18 due to the temperature change. The large stress is generated in the plating layer 18 which is an electroless Ni—P plating layer, and hence the adhesion to the resin film 16 made of polyimide is easily reduced. According to the embodiment, since the cover film 20 covers the side surface of the plating layer 18, it is possible to suppress the solder from entering. The base layer 17 can be made of a metal other than Pd, such as Cu. The plating layer 18 is made of a metal other than Ni, such as the metal having laminated structure of nickel and gold (Ni/Au) or laminated structure of nickel and silver (Ni/Ag). Further, instead of the plating layer 18, Ti/NiV/Ag layers laminated by sputtering may be used.

It is preferable to apply the flux to the surface of the plating layer 18 before the reflow treatment to remove an oxide film on the surface, thereby improving solder wettability. By providing a metal film such as Au, which has higher solder wettability than Ni, on the surface of the plating layer 18, the solder wettability can be improved. However, the solder wettability of the interface between the plating layer 18 and the base layer 17 becomes high, and there is a possibility that the solder may penetrate. The plating layer 18 is made of a metal having low solder wettability such as Ni and the flux is applied to the surface of the plating layer 18, which makes it possible to improve the solder wettability and suppress the penetration of the solder at the same time. Here, the wettability can be evaluated by the magnitude of an angle (contact angle) of a region where a solder mounting surface and a surface of the solder intersect. It is judged that the larger the angle, the lower the wettability, and the smaller the angle, the higher the wettability.

The melting point of the solder is, for example, 250° C. or less, and the temperature in the reflow treatment is 260° C., which is equal to or more than the melting point. The temperature in the heat treatment is equal to or more than the melting point of the solder. In the heat treatment, for example, the temperature is set to 300° C. or more and 400° C. or less for a period of time between 20 minutes and 40 minutes. The temperature may be 350° C. or more and 400° C. or less. By raising the temperature to a temperature equal to or higher than the temperature of the reflow treatment by the heat treatment, the gap 15 can be formed in advance between the UBM 19 and the resin film 16. The cover film 20 can close the gap 15 and suppress the solder from entering. Since a part of the UBM 19 is already peeled off from the resin film 16 by the heat treatment, peeling is unlikely to occur in the reflow treatment. Therefore, the stress is less likely to be applied to the cover film 20 in the reflow treatment.

The adhesion between the cover film 20 and the resin film 16 is preferably higher than the adhesion between the UBM 19 and the resin film 16. The solder wettability of the cover film 20 is preferably lower than that of the UBM 19, for example. For example, the cover film 20 is made of Zn, Cr, Ti, Mo, Al or Fe, or an alloy including at least one of these metals. The solder is less likely to spread over the surface of the cover film 20, and it is possible to suppress the entry of the solder and the short circuit between the plurality of solder balls 22. In order to suppress the loss of an electric signal, an electric resistance of the cover film 20 is preferably larger than those of, for example, the UBM 19, the wiring layer 14, and the solder balls 22.

The cover film 20 covers the upper surface of the resin film 16, and the side surface and the upper surface of the UBM 19. Since the cover film 20 rides on the upper surface of the UBM 19, the cover film 20 is less likely to peel off, and the solder can be effectively suppressed from entering. The cover film 20 preferably completely surrounds the UBM 19.

The arrangement of pads of the semiconductor device 100 may be the BGA as illustrated in FIG. 1A, or may be other than the BGA. The substrate 10 is made of an insulator such as SiC, silicon (Si), sapphire, or GaN. The semiconductor layer 12 is a compound semiconductor layer made of, for example, a nitride semiconductor or an arsenic-based semiconductor. The nitride semiconductor is a semiconductor including nitrogen (N), such as GaN, AlGaN, indium gallium nitride (InGaN), indium nitride (InN), and aluminum indium gallium nitride (AlInGaN). The arsenic-based semiconductor is a semiconductor including arsenic (As) such as gallium arsenide (GaAs). A semiconductor element other than the FET may be formed on the semiconductor layer 12.

The embodiments of the present disclosure have been described in detail. However, the scope of the present invention is not limited to the specific embodiments of the disclosure. It is to be understood that the scope of the present invention is defined in the appended claims and includes equivalence of the description of the claims and all changes within the scope of the claims.

What is claimed is:

1. A method for manufacturing a semiconductor device comprising:
   forming a thermosetting resin film on a first metal layer;
   forming an opening in the resin film;
   forming a second metal layer that covers a region from an upper surface of the first metal layer exposed from the opening of the resin film to an upper surface of the resin film;
   performing heat treatment at a temperature equal to or higher than a temperature at which the resin film is cured after forming the second metal layer so as to form a gap between a lower surface of the second metal layer and the upper surface of the resin film;
   forming a cover film that covers the upper surface of the resin film and a side surface of the second metal layer after performing the heat treatment, the cover film surrounding the second metal layer and the gap and closing the gap; and
   forming a solder on an upper surface of the second metal layer exposed from an opening of the cover film after forming the cover film.

2. The method for manufacturing the semiconductor device according to claim 1, wherein
   the resin film is a polyimide film.

3. The method for manufacturing the semiconductor device according to claim 1, wherein
   the forming of the second metal layer includes:
   forming a third metal layer that covers the region from the upper surface of the first metal layer exposed from the opening of the resin film to the upper surface of the resin film; and
   forming a fourth metal layer that covers a region from an upper surface of the third metal layer to a portion of the upper surface of the resin film that is outside the third metal layer.

4. The method for manufacturing the semiconductor device according to claim 3, wherein
   the first metal layer includes gold,
   the third metal layer includes palladium, and
   in forming the fourth metal layer, the fourth metal layer is formed to include nickel by electroless plating treatment.

5. The method for manufacturing the semiconductor device according to claim 1, wherein
   a solder wettability of the cover film is lower than that of the second metal layer.

6. The method for manufacturing the semiconductor device according to claim 1, wherein
   in forming the cover film, the cover film is formed to cover a region from the upper surface of the resin film to the upper surface of the second metal layer.

7. The method for manufacturing the semiconductor device according to claim 1, wherein
   the temperature during the heat treatment is equal to or more than a melting point of the solder.

8. A method for manufacturing a semiconductor device comprising:
   forming a thermosetting resin film on a first metal layer;
   forming an opening in the resin film;
   forming a second metal layer that covers a region from an upper surface of the first metal layer exposed from the opening of the resin film to an upper surface of the resin film;
   performing heat treatment at a temperature equal to or higher than a temperature at which the resin film is cured after forming the second metal layer;
   forming a cover film that covers the upper surface of the resin film and a side surface of the second metal layer after performing the heat treatment; and forming a solder on an upper surface of the second metal layer exposed from an opening of the cover film after forming the cover film, wherein the forming of the second metal layer includes:

forming a third metal layer that covers the region from the upper surface of the first metal layer exposed from the opening of the resin film to the upper surface of the resin film; and forming a fourth metal layer that covers a region from an upper surface of the third metal layer to a portion of the upper surface of the resin film that is outside the third metal layer, and wherein the first metal layer includes gold, the third metal layer includes palladium, and in forming the fourth metal layer, the fourth metal layer is formed to include nickel by electroless plating treatment.

* * * * *